United States Patent
Lai et al.

(12)

(10) Patent No.: US 6,190,810 B1
(45) Date of Patent: Feb. 20, 2001

(54) MARK FOCUSING SYSTEM FOR STEPPERS

(75) Inventors: Feng-Liang Lai; Ming-Huei Tseng, both of Hsin-Chu; Li-Kong Turn, Taichung; Li-Wei Kung, Zhong-he, all of (TW)

(73) Assignee: Taiwan Semiconductor Manufacturing Company, Hsin-Chu (TW)

( * ) Notice: Under 35 U.S.C. 154(b), the term of this patent shall be extended for 0 days.

(21) Appl. No.: 09/483,037

(22) Filed: Jan. 18, 2000

(51) Int. Cl.⁷ .......................................................... G03F 9/00
(52) U.S. Cl. .................................................. 430/22; 430/30
(58) Field of Search .......................................... 430/22, 30

(56) References Cited

U.S. PATENT DOCUMENTS

| | | | |
|---|---|---|---|
| 4,580,900 | 4/1986 | Larsen | 356/400 |
| 4,615,621 | 10/1986 | Allen et al. | 356/399 |
| 5,783,340 | 7/1998 | Farino et al. | 430/22 |

OTHER PUBLICATIONS

Tseng et al., "Investigation of best focus shift issues from focusing system of ASML PAS–5000/50 steppers", Taiwan Semiconductor Manufacturing Company, Hsin–Chu, Taiwan, R.O.C., pp. 1–8.

*Primary Examiner*—Christopher G. Young
(74) *Attorney, Agent, or Firm*—George O. Saile; Stephen B. Ackerman

(57) ABSTRACT

Single spot laser focusing systems are widely used by photolithographic stepping systems. The stage is moved until a spot, located in the immediate area in which the image is to be projected, achieves minimum size. This system is sensitive to the local topography within the area of the image and this can lead to less than optimum results. The present invention overcomes this problem by a process in which the spot is always directed to fall within an alignment mark field (as opposed to within the integrated circuit field). Several ways for accomplishing this are described.

19 Claims, 2 Drawing Sheets

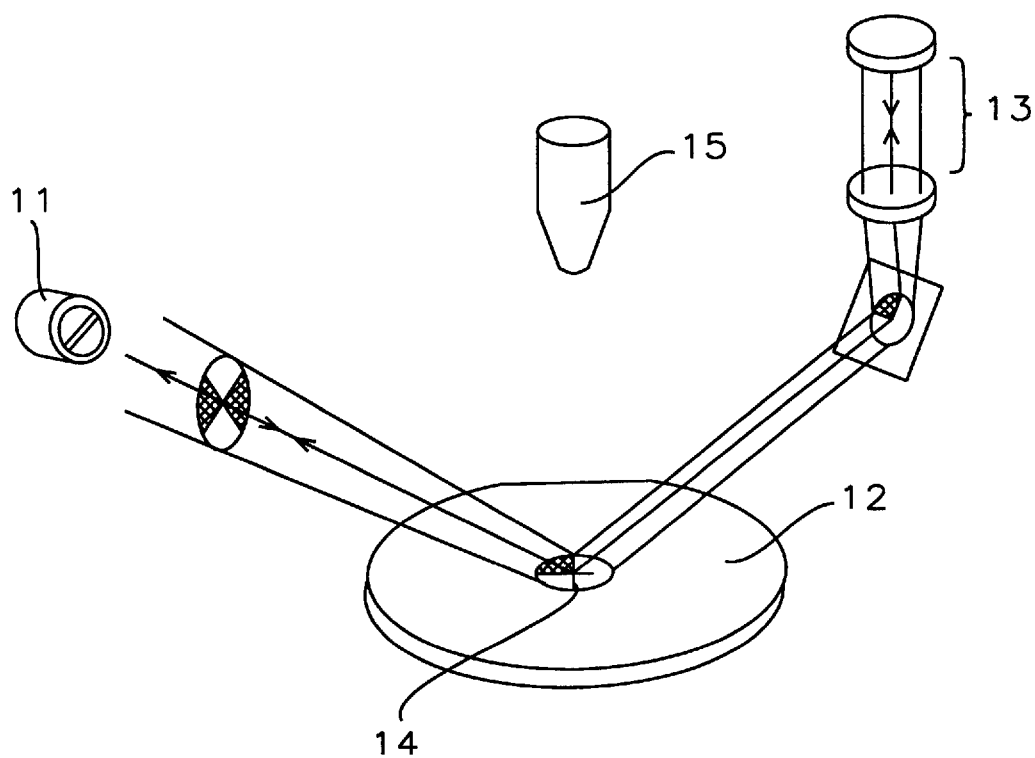
FIG. 1
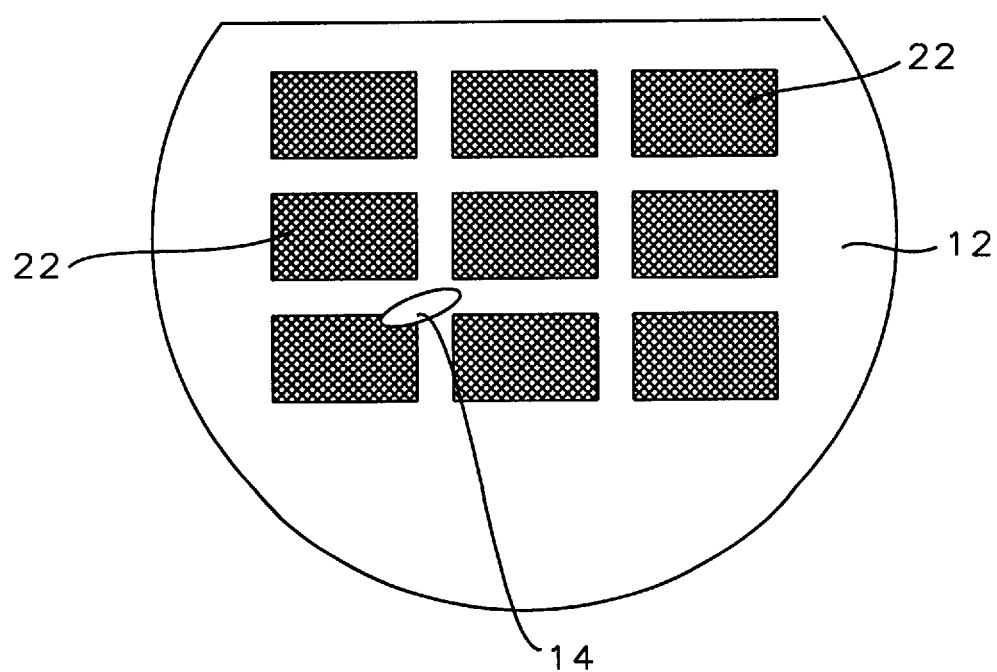
FIG. 2 - Prior Art

MARK FOCUSING SYSTEM FOR STEPPERS

FIELD OF THE INVENTION

The invention relates to the general field of photolithography with particular reference to the problems associated with sharp focusing.

BACKGROUND OF THE INVENTION

Improvements in photolithography over the years have been responsible for many of the advances in integrated circuit technology in general. As these circuits have grown increasingly more complex, the number of different layers in the finished product has also grown considerably. Although it is general practice to planarize the surface of the wafer at regular intervals throughout the process, it is nevertheless impossible to avoid situations in which the surface onto which a given image is being focused for photolithographic purposes is quite uneven. It thus becomes necessary to devise a technique for always obtaining the "best focus", i.e. the best compromise for that particular surface.

Solutions to this "best focus" problem are included in commercial steppers such as the PAS-5000/50 I-line system which uses averaged information of step height over a fixed probing area of an image field to determine the focal plane and to perform field by field focusing. The focusing system comprises a focus sensor, control electronics, and actuator. It is illustrated in FIG. 1. The focus sensor 11 operates by reflecting laser light off the surface of wafer 12 (which is free to move vertically relative to projection lens 15) into cat's eye reflector 13 which sends the beam back along the same path. In effect, the sensor determines when the diameter of light spot 14, on the wafer surface, is at a minimum. Projection lens 15 is positioned to be directly above spot 14 and is both vertically and horizontally fixed relative to the focusing system in such a way that when spot 14 is at minimum diameter an image projected through the lens onto the wafer surface will be in focus there.

FIG. 2 is a schematic representation of semiconductor wafer 12, showing a small array of fields (or reserved areas) such as 22 within which various images needed to process the integrated circuit will be formed. In a real wafer, the number of such 'integrated circuit' fields will normally be much larger (generally between about 90 and 150 such fields per wafer). Also seen in FIG. 2 is light spot 14 (as originally shown in FIG. 1). Because of the geometrical constraints associated with this prior art design, the light spot 14 is necessarily located fully or partly within an integrated circuit field.

In the course of using steppers of this type, we have determined that the focus spot plays such a great role in the focusing system that any minor variation in its position, size and overlap has a major effect on focusing performance. The "best focus" is usually determined as the center between two defocus points, where critical dimensions (CDs), resist sidewall profile, and resist loss would lead to final CD (usually ±4% variation) and profile errors after etch.

Experiments demonstrated that the step topography was an important factor in deciding the best focus. Due to its dependence on step topography, the collected information of the probing area, where the focus laser spot was hit, could be strongly affected by local variations in layout and topography. The auto-focus design of PAS-5000/50 obviously detected the surface substrates already patterned, and, inevitably introduced focus errors. Some of these can be enormous particularly when the laser spot position has a displacement on the wafer (say 800 microns) with respect to the original position. The reason lies in the different step topography information that is collected by the probing laser spot with fixed detection area.

The problems described above are most severe during processing of back-end lithography layers when lack of surface smoothness is most prevalent. Among the most common defects that are introduced as a result of this are blind via holes and damaged metal lines. There is therefore a need for an automatic focusing process that is not dependent on, nor subject to error when dealing with, varying topographies.

A routine search of the prior art was conducted but no references describing the process taught by the present invention were encountered. Several references of interest were, however, found. For example, Farino et al. In U.S. Pat. No. 5,783,340, show an auto-focusing alignment technique. Larsen (U.S. Pat. No. 4,580,900) teaches an auto-focus alignment and measurement system that uses a photodiode while Allen, in U.S. Pat. No. 4,615,621, teaches a similar system.

SUMMARY OF THE INVENTION

It has been an object of the present invention to provide a process for focusing a projected image during photolithography of integrated circuits.

Another object of the invention has been that said process be independent of the topography at the surface where said image is to be projected.

These objects have been achieved by using a single spot laser focusing system in which said spot is always directed to fall within an alignment mark field as opposed to within an integrated circuit field, as is current practice. Several ways for accomplishing this are described.

BRIEF DESCRIPTION OF THE DRAWINGS

FIG. 1 shows a single spot laser focusing system.

FIG. 2 is a schematic representation of a semiconductor wafer showing an array of integrated circuit fields.

DESCRIPTION OF THE PREFERRED EMBODIMENTS

Figure 3:
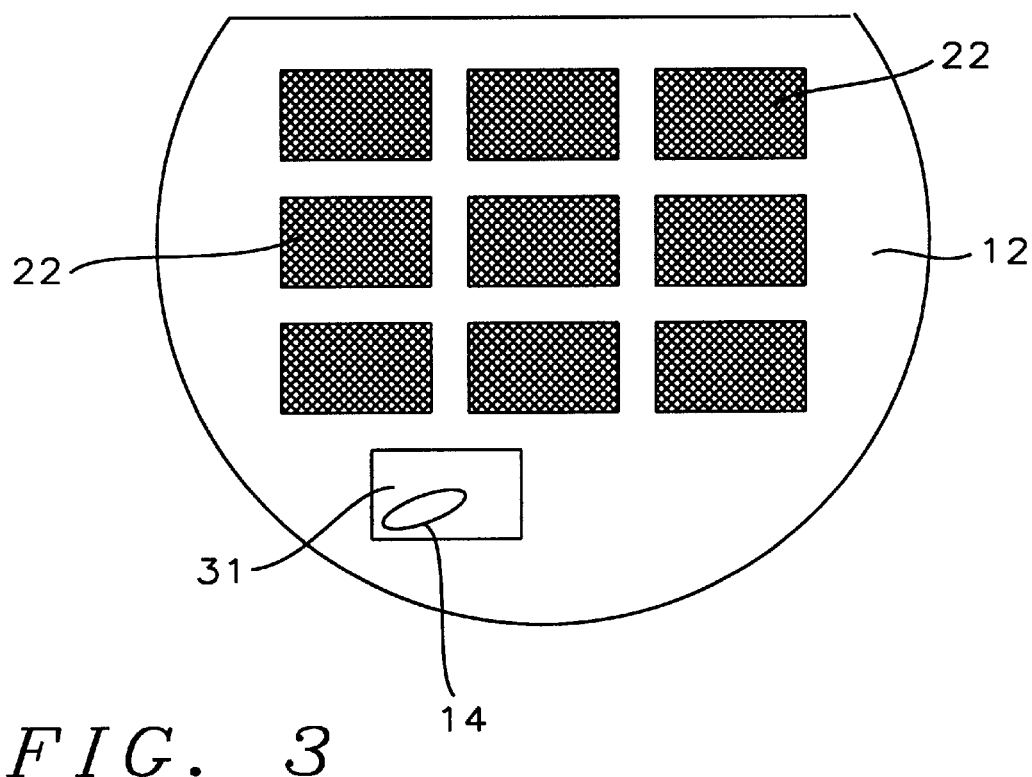
FIG. 3 shows the wafer of FIG. 2 with the addition of a mark alignment field.
Figure 4:
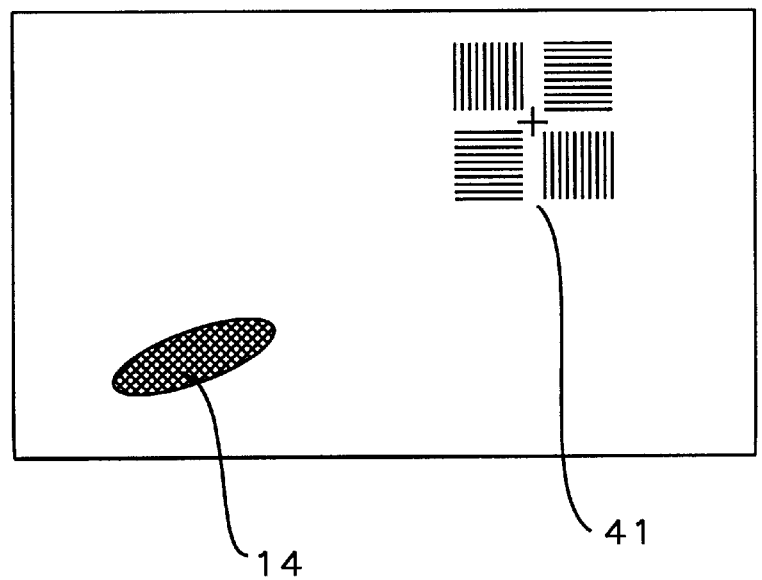
FIG. 4 is a closeup view of said mark alignment field.

Referring now to FIG. 3, we show there the schematic wafer representation already seen in FIG. 2 with the added inclusion of alignment mark area 31. This (and similar areas located elsewhere on the chip) are a standard feature of any chip manufacturing process, being always present in one form or another. In FIG. 4 we show an enlarged view of mark alignment area 31 showing alignment mark 41. As can be seen, most of the area occupied by the alignment mark in the alignment mark field is empty. Furthermore, the alignment mark is a straightforward pattern with a simple topography. These qualities make the alignment mark field a suitable area for detecting the behavior of focusing spot 14 (as also seen in FIG. 4).

In order to be able to make use of the alignment mark field for focusing purposes, it is necessary to make the horizontal motion of the projection lens independent of that of the focusing system—unlike the prior art systems discussed above where the projection lens and the focusing system move together both vertically and horizontally. All motion of the wafer (actually the X-Y stage on which it sits, and which is not shown) continues to be fully independent of both the projection and focusing systems.

The process of the present invention begins with mounting the semiconductor (silicon, germanium, gallium arsenide, etc.) wafer on an X-Y stage which is located below the projection lens and which is normally an integral part of the stepper system. The wafer is positioned under the projection lens so that the image projected by the lens will lie precisely in one of the integrated circuit fields on the surface of the wafer. In practice this would be the surface of a layer of photoresist, between about 0.9 and 3 microns thick, that is to be exposed and patterned.

In a key departure from the prior art, the reflection focusing system is independently moved in a horizontal plane by moving the X-Y stage (the vertical relationship to the projection lens remaining unchanged) so that the single spot 14 can be located within alignment mask field 31. Once this has been accomplished, focusing proceeds as normal. That is, the X-Y stage and wafer are moved vertically until the single spot has minimum size (typically between about 200 and 800 microns), and this causes the image in the integrated circuit field to be in focus.

Once focus has been achieved, actinic radiation is directed through the projection lens to suitably expose the photoresist and the process is repeated for all remaining integrated circuit fields, until the entire wafer has been exposed, whereupon development of the photoresist can be effected.

The key feature of the present invention is thus the fact that the light spot is always located inside the alignment mark field whenever focusing occurs. There are several ways in which this feature may be implemented:

First Embodiment

The focusing system is mechanically connected to the X-Y stage in a manner such that it moves with the stage in a horizontal plane but is independent of the stage for vertical motion. Thus, once the single spot has been placed within the alignment mark field through fine adjustment, it will continue to be there even though the X-Y stage is moved relative to the projection lens.

Second Embodiment

In this embodiment, the co-ordinates on the wafer at which the spot is to be placed are known to the system so that, after the X-Y stage has placed a given integrated circuit field directly below the projection lens, the laser focus system is independently moved in a horizontal plane to said co-ordinate position so that the spot is once more located inside the alignment mark field.

Third Embodiment

This embodiment is similar to the second embodiment in that the single spot must be returned to the alignment mark field each time the X-Y stage moves to a new integrated circuit field. However movement of the spot is done under control of the same software that is used to move the X-Y stage in a horizontal plane.

While the invention has been particularly shown and described with reference to the preferred embodiments thereof, it will be understood by those skilled in the art that various changes in form and details may be made without departing from the spirit and scope of the invention.

What is claimed is:

1. A process for focusing a stepper system, that includes a projection lens and an X-Y stage, during photolithography, comprising:

(a) providing a semiconductor wafer having an upper surface that further comprises a plurality of fields in each of which an integrated circuit chip image is to be formed;

(b) providing on said upper surface an additional field which contains an alignment mark;

(c) providing a single spot laser reflection focusing system that has a fixed vertical separation from the projection lens such that an image formed by the projection lens is in focus at a plane on which said single spot has minimum size;

(d) mounting the wafer on the X-Y stage;

(e) positioning the projection lens to form an image in an integrated circuit field, by by horizontally moving the X-Y stage to place the projection lens directly above said field;

(f) positioning the reflection focusing system so that said single spot is located within the alignment mask field;

(g) moving the X-Y stage and wafer vertically until the single spot has minimum size, thereby focusing the image in the integrated circuit field; and (h) repeating steps (e) and (f) for other integrated circuit fields until images have been formed in all said integrated circuit fields with the light spot always being located inside the alignment mark field whenever focusing occurs.

2. The process of claim 1 wherein the laser focus system has a fixed horizontal separation from, and independent vertical motion relative to, said X-Y stage such that the spot falls inside the alignment mask field at all times.

3. The process of claim 2 wherein said fixed horizontal separation is achieved by mechanical means.

4. The process of claim 1 further comprising providing independent means for moving the laser spot in a horizontal plane.

5. The process of claim 4 wherein, after the X-Y stage has placed a given integrated circuit field directly below the projection lens, the laser focus system is independently moved in a horizontal plane, by moving the X-Y stage, until the spot is located inside the alignment mark field.

6. The process of claim 4 wherein, through use of software common to both means for achieving X-Y motion, the spot is moved by the same amount as, and in the opposite direction to, the wafer.

7. The process of claim 1 wherein the wafer is silicon or germanium or gallium arsenide.

8. The process of claim 1 wherein there are between about 70 and 150 integrated circuit fields on the wafer.

9. The process of claim 1 wherein the spot has a minimum diameter between about 200 and 800 microns.

10. A process for photolithography, comprising:

(a) providing a stepper system that includes a projection lens and an X-Y stage;

(b) providing a semiconductor wafer having an upper surface that further comprises a plurality of fields in each of which an integrated circuit chip image is to be formed;

(c) providing on said upper surface an additional field which contains an alignment mark;

(d) providing a single spot laser reflection focusing system that has a fixed vertical separation from the projection lens whereby an image formed by the projection lens is in focus at a plane on which said single spot has minimum size;

(e) depositing a layer of photoresist on the wafer;

(f) mounting the wafer on the X-Y stage;

(g) moving the X-Y stage to place the projection lens directly above an integrated circuit field and positioning the reflection focusing system so that said single spot is located within the alignment mask field;

(h) moving the X-Y stage and wafer vertically until the single spot has minimum size, thereby ensuring that an image projected through the projection lens will be in focus in the integrated circuit field;

(i) directing actinic radiation through the projection lens thereby exposing the photoresist in said integrated circuit field;

(j) repeating steps (g), (h), and (i) for other integrated circuit fields until images have been formed in all the integrated circuit fields with the light spot being located inside the alignment mark field whenever photoresist is being exposed; and (k) then developing the layer of photoresist.

11. The process of claim 10 wherein the laser focus system has a fixed horizontal separation from, and independent vertical motion relative to, said X-Y stage such that the spot falls inside the alignment mask field at all times.

12. The process of claim 11 wherein said fixed horizontal separation is achieved by mechanical means.

13. The process of claim 10 further comprising providing independent means for moving the laser spot in a horizontal plane.

14. The process of claim 13 wherein, after the X-Y stage has placed a given integrated circuit field directly below the projection lens, the laser focus system is independently moved in a horizontal plane by moving the X-Y stage until the spot is located inside the alignment mark field.

15. The process of claim 13 wherein, through use of software common to both means for achieving X-Y motion, the spot is moved by the same amount as, and in the opposite direction to, the stage.

16. The process of claim 10 wherein the wafer is silicon or germanium or gallium arsenide.

17. The process of claim 10 wherein there are between about 70 and 150 integrated circuit fields on the wafer.

18. The process of claim 10 wherein the spot has a minimum diameter between about 200 and 800 microns.

19. The process of claim 10 wherein the layer of photoresist has a thickness between about 0.9 and 3 microns.

* * * * *